United States Patent [19]

Moriizumi et al.

[11] Patent Number: 5,008,830
[45] Date of Patent: Apr. 16, 1991

[54] METHOD OF PREPARING DRAWING DATA FOR CHARGED BEAM EXPOSURE SYSTEM

[75] Inventors: Koichi Moriizumi; Takeshi Fujino, both of Itami, Japan

[73] Assignee: Mitsubishi Denki Kabushiki Kaisha, Japan

[21] Appl. No.: 278,452

[22] Filed: Dec. 1, 1988

[30] Foreign Application Priority Data

Aug. 10, 1988 [JP] Japan ................. 63-198032

[51] Int. Cl.$^5$ ................ G06F 15/60; G06F 15/20
[52] U.S. Cl. ................ 364/490; 364/489; 364/488; 250/492.2 B; 250/398; 250/396 R
[58] Field of Search ............ 364/488, 489, 490, 491; 250/396 R, 398, 492.1, 492.2 R, 492.2 B

[56] References Cited

U.S. PATENT DOCUMENTS

| | | | |
|---|---|---|---|
| 4,409,686 | 10/1983 | Ports et al. | 364/491 |
| 4,482,810 | 11/1984 | Cooke | 364/491 |
| 4,531,191 | 7/1985 | Koyama | 364/491 |
| 4,613,940 | 9/1986 | Shenton et al. | 364/491 |
| 4,789,945 | 12/1988 | Niijima | 364/491 |
| 4,820,928 | 4/1989 | Ooyama et al. | 364/491 |
| 4,833,621 | 5/1989 | Umatate | 364/49 |
| 4,878,177 | 10/1989 | Ikenaga et al. | 364/490 |
| 4,890,238 | 12/1989 | Klein et al. | 364/491 |

FOREIGN PATENT DOCUMENTS 58-127324 7/1983 Japan .

OTHER PUBLICATIONS

Koyama et al., "Hierarchical Data ... System EX-7", First Micro Process Conference, 1988, pp. 28–29.

Primary Examiner—Parshotam S. Lall
Assistant Examiner—V. N. Trans
Attorney, Agent, or Firm—Leydig, Voit & Mayer

[57] ABSTRACT

A method of preparing drawing data for a charged beam exposure system includes: constructing, from pattern data having a multiple hierarchical structure, reiterative units disposed in an array without any gap formed therebetween; converting the pattern data into first figure processing data including a total figure and reiterative units within the total area; dividing the total area of the first figure into equal area processing data fields for a charged beam exposure system, each field including a whole number of reiterative units, if any, thereby producing second figure processing data; performing figure modification processing with respect to features in a field outside reiterative units in the field and separately with respect to the reiterative units within the field, thereby producing third figure processing data; and converting the third figure processing data into suitable drawing data for the charged beam exposure system.

8 Claims, 7 Drawing Sheets

FIG. 2A
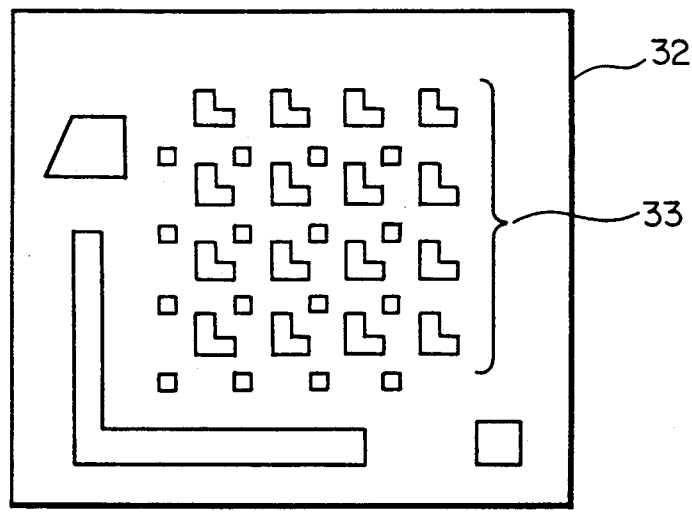
FIG. 2B
FIG. 2C
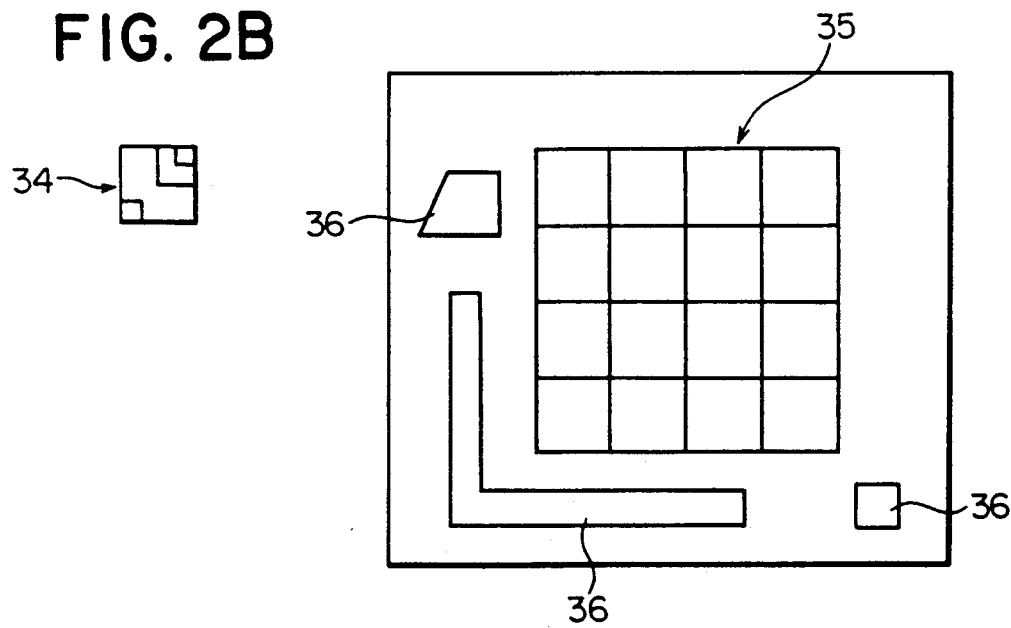

METHOD OF PREPARING DRAWING DATA FOR CHARGED BEAM EXPOSURE SYSTEM

BACKGROUND OF THE INVENTION

1. Field of the Invention

This invention relates to a method of preparing drawing data for a vector-scan type charged beam exposure system which draws patterns of a semiconductor integrated circuit or the like on a mask or a semiconductor wafer.

2. Description of the Related Art

A conventional method of preparing charged beam drawing data will be described below with reference to a flow chart shown in FIG. 8. Pattern data output from a CAD (computer aided design) system is first stored in a data base 1. Ordinarily, this pattern data has a multiple hierarchic structure constituted by data representing groups which include some figures (cells) and placement information for the cells. The pattern data stored in the data base 1 are flattened into figure processing data without a hierarchic structure in a hierarchic structure flattening step 2 and are stored in a data base 3. At this time, all data are expressed as fundamental figures such as rectangles, trapezoids and other polygons. In some cases, reiterating disposition information may be attached to the data on each fundamental figure.

In a field division step 4, the figure processing data stored in the data base 3 are divided with respect to each unit size of drawing region (hereinafter referred to as "field") which depends on a charged beam exposure system and are thereafter stored in a data base 5. Next, various figure modification processings are performed in an overlap-removal/tone-reversal step 6 and a figure magnification/reduction processing step 8. That is, in the overlap-removal/tone-reversal step 6, overlaps between the fundamental figures are removed and, at the same time, the data undergo tone-reversal if necessary and are stored in a data base 7. At this time, the figures which have reiterating disposition information are all exploded. Then, in figure magnification/reduction processing step 8, the figure processing data stored in the data base 7 undergoe magnification or reduction of each fundamental figure, and are thereafter stored in a data base 9. In this step, magnification or reduction of each fundamental figure is effected to an extent corresponding to a degree of necessary fine adjustment for a specific manufacturing technique, such as etching in order that the patterns can be actually formed by this technique in conformity with the design. The magnifying or reducing operation is performed in consideration of connections between fundamental figures.

After having undergone the processing modifying the figures, the figure processing data is finally processed in a formatting step 10 in such a manner that polygons in the fundamental figures are divided into rectangles or trapezoids and are converted into a format suitable for the charged beam exposure system, finally being stored as drawing data for changed beam exposure system in a data base 11.

In the conventional method of preparing charged beam drawing data, pattern data of a multiple hierarchic structure output from a CAD system are flattened into data on fundamental figures. Moreover, figures with reiterating disposition information are all exploded, and the data thereafter undergoes figure modification processing including overlap-removal/tone-reversal processing and figure magnification/reduction processing, thereby necessitating a large data storage capacity for preparation of charged beam drawing data as well as requiring much time for processing.

Under the existing conditions of increasingly developed design for high-density semiconductor devices, the data storage capacity needed for preparation of drawing data has become excessive, and it is possible that, in practice, necessary charged beam drawing data cannot be prepared.

SUMMARY OF THE INVENTION

In view of these problems, it is an object of the present invention to provide a method of preparing charged beam drawing data, the method enabling, with a small data storage capacity, preparation of drawing data for a charged beam exposure system to be performed in a short time.

To this end, the present invention provides a method of preparing drawing data for a charged beam exposure system, comprising the steps of:

constructing, from pattern data having a multiple hierarchic structure, reiterative unit which means a group of some figures disposed in an array, and an area within which the unit figures are laid without any gap formed therebetween, and thereby converting the pattern data into a first figure processing data having a two-hierarchy structure including a total figure having the above areas and the units;

dividing the total figure of the first figure processing data, on the inside and outside of the above area separately from each other, with respect to unit size of drawing regions of the charged beam exposure system to form a second figure processing data;

performing figure modification processing with respect to figures outside the above area and the unit figure of the second figure processing data separately from each other to form a third figure processing data; and converting the third figure processing data into a format suitable for the charged beam exposure system to provide the converted data as drawing data.

BRIEF DESCRIPTION OF THE DRAWINGS

FIGS. 2A to 2C are diagrams illustrating a unit and an area construction step;

DESCRIPTION OF THE PREFERRED EMBODIMENT

An embodiment of the present invention will be described below with reference to the accompanying drawings.

Figure 1:
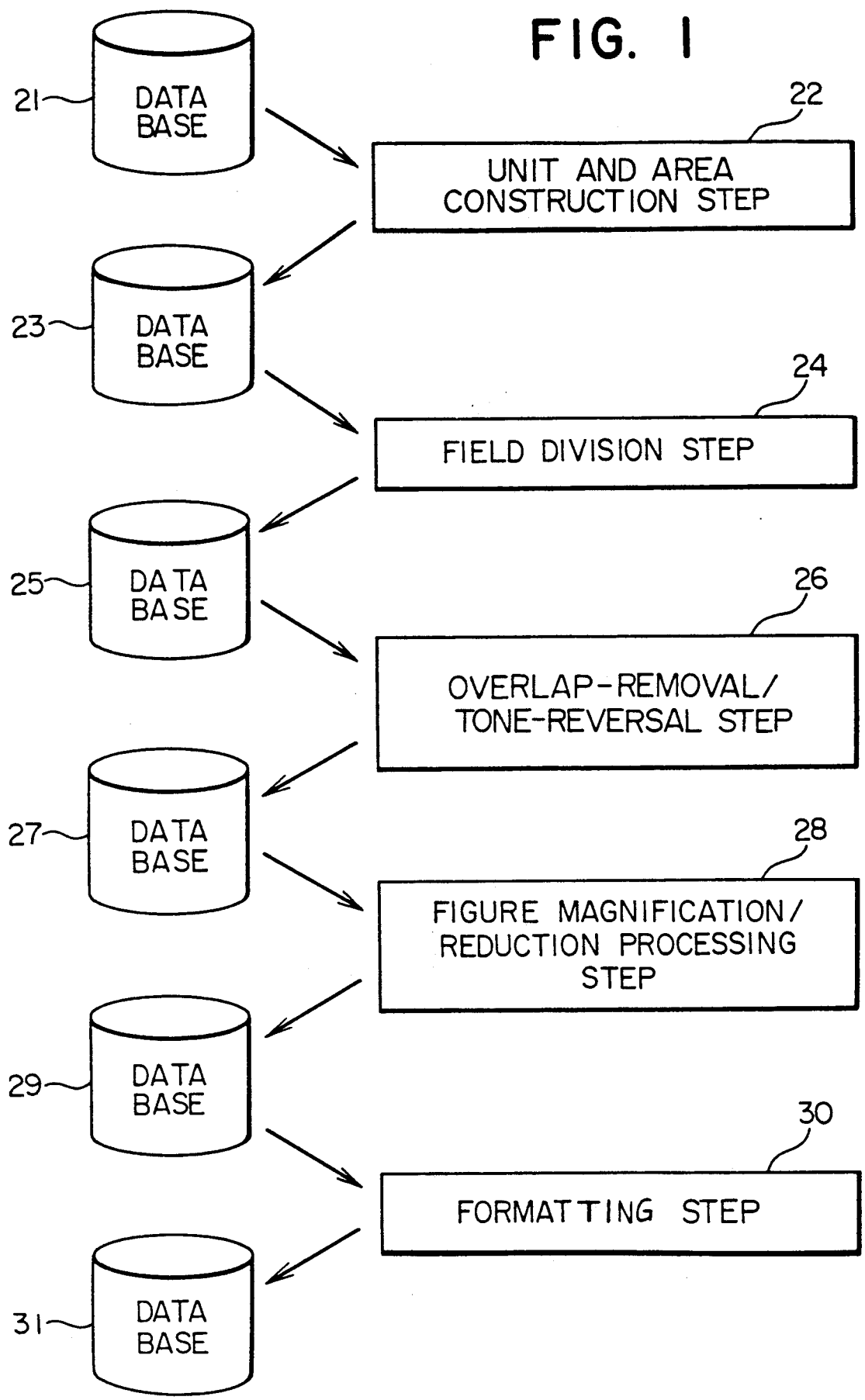
FIG. 1 is a schematic flow chart of a method of preparing charged beam drawing data which represents an embodiment of the present invention.

FIG. 1 schematically shows a method of preparing charged beam drawing data in accordance with the present invention. Pattern data which has a multiple hierarchical structure and which has been output from a designing system such as a CAD system is first stored in a data base 21. The pattern data stored in the data base 21 is then analyzed in a unit and area construction step 22 so that units, which include some figures that are disposed in an array, and an area in which these unit figures are laid out without overlapping each other and without any gap formed therebetween, are constructed. For example, a group of arrayed figures 33 are found from a whole pattern 32 as shown in FIG. 2A, and a unit 34 such as that shown in FIG. 2B and an area 35 such as that shown in FIG. 2C are constructed. Particularly, in step 22, the whole pattern 32 is first divided into a first group of figures having reiterating disposition information and a second group of figures not having such information. The figures having the same reiterating disposition information are then selected from the first group to form a unit 34. At this time, there are no other figures 36 in the area 35. If there are a plurality of areas 35, any overlaps between the areas 35 are avoided.

Figure 3:
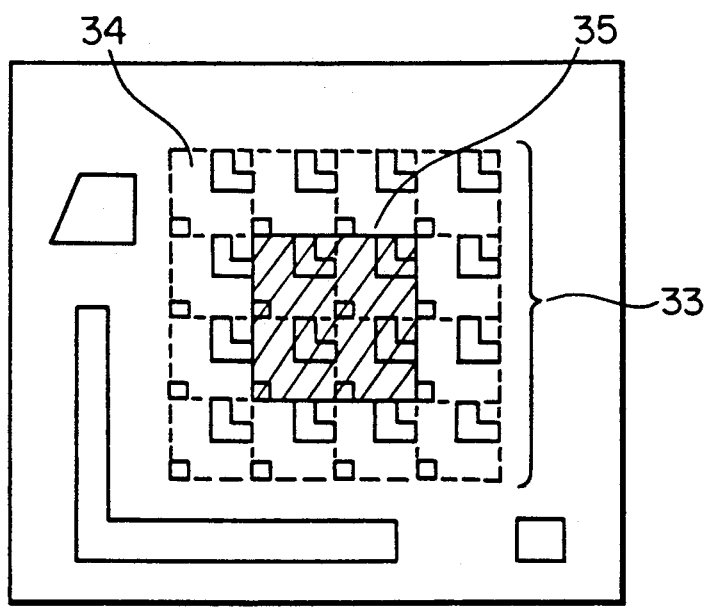
FIG. 3 is an illustration of a method of determining area according to the present invention.

If figure magnification/reduction processing is performed later, the area 35 is defined by removing a peripheral portion of the array of the grouped figures 33 which is formed of a single row of figures 34, as shown in FIG. 3, in order to maintain the continuity of figures at the boundary of the area 35 after the magnifying or reducing operation.

Figure 4A:
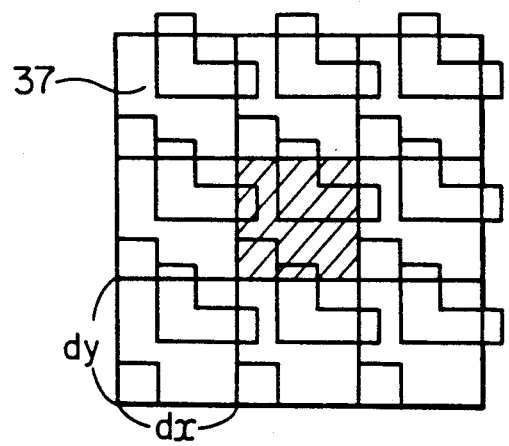
FIGS. 4A to 4C are diagrams illustrating a method of determining a unit according to the present invention.
Figure 4B:
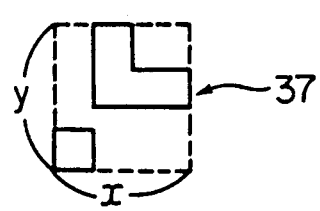
Figure 4C:
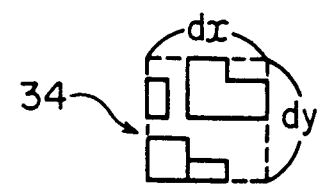

If, as shown in FIG. 4A, the size (x×y) of the unit shown in FIG. 4B constituting the group of some figures becomes greater than array disposition pitches dx and dy because the figures 37 are disposed in the array while slightly overlapping each other, a hatched area (dx × dy) in the array of figures 37 adjacently disposed so as to face each other on all sides, as shown in FIG. 4A, is cut out as a unit 34 (FIG. 4C). In this case, the area 35 is set to an area defined by removing a peripheral portion of the array of the grouped figures 33 formed of a single row of figures 34 irrespective of whether or not figure magnification/reduction processing is performed later. This step also required in order to maintain the continuity of figures at the boundary of the area 35.

Thus, the pattern data stored in the data base 21 is converted into first figure processing data which has a two-hierarchy structure including the total figure, i.e., the area 35 and the unit 34 and which is expressed as fundamental figures including rectangles, trapezoids and other polygons. All above mentioned processes are performed by software. The converted data is thereafter stored in a data base 23 shown in FIG. 1.

Figure 5A:
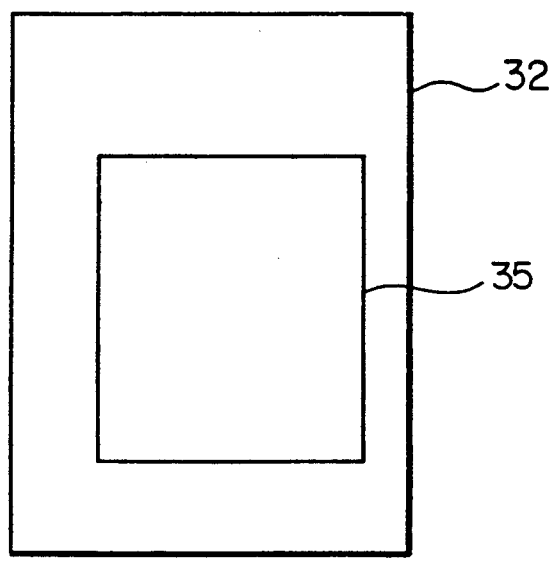
FIGS. 5A to 5C are diagrams showing a field division step.
Figure 5B:
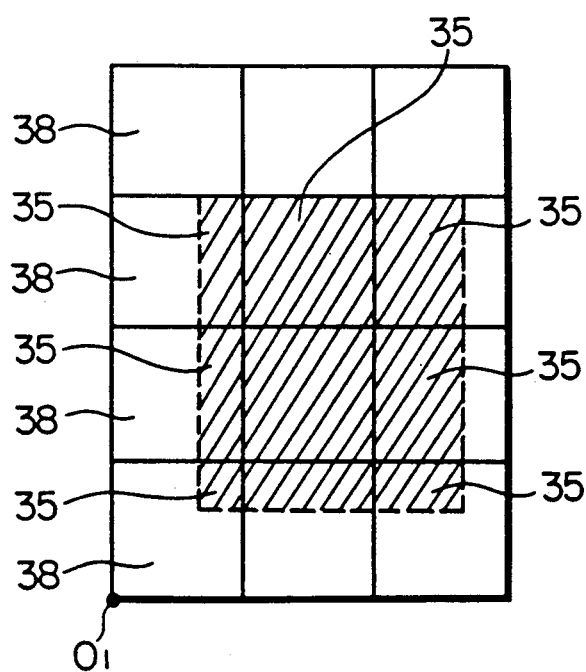
Figure 5C:
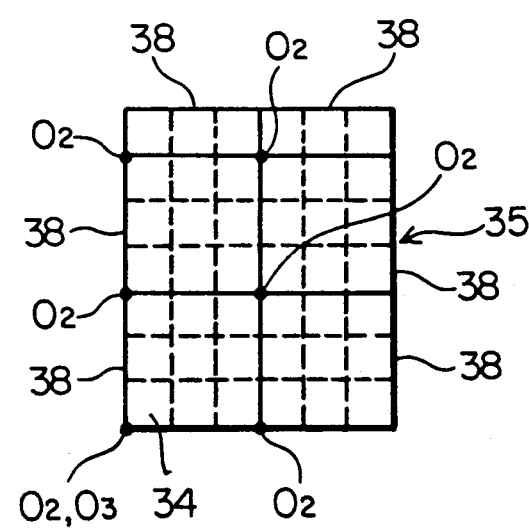

Next, in a field division step 24, the first figure processing data is divided with respect to unit size of drawing regions (field) which depends on a charged beam exposure system for performing exposure processing, and is thereafter stored as second figure processing data in a data base 25. At this time, field division is separately effected inside and outside of the area 35. For example, the peripheral pattern 32 outside the area 35 shown in FIG. 5A is divided into a plurality of fields 38 based on the origin $O_1$ of the pattern 32 irrespective of the area 35, as shown in FIG. 5B. With respect to the area 35, the pattern 32 is divided as shown in FIG. 5C, so that the origin $O_2$ of each field 38 is always located at a distance from the origin $O_3$ of the area 35 defined by multiplying the dimension of the unit 34 by an integer. This setting enables the continuity of figures at interfaces between adjacent fields 38.

Thereafter, the second figure processing data stored in the data base 25 undergoes various figure modification processing in an overlap-removal/tone-reversal processing step 26 and a figure magnification/reduction processing step 28. These modification processings are separately performed with respect to areas inside and outside the area 35 That is, in the overlap-removal/tone-reversal processing step 26, overlaps between fundamental figures outside the area 35 are removed and, at the same time, tone-reversal processing is performed if necessary, while overlap-removal/tone-reversal processing is performed in a similar manner with respect to unit 34. If, at this time, the area 35 partially intrudes into the fields 38 divided from the pattern 32 outside the area 35, tone-reversal processing is performed with respect to these portions of the area 35 as in the case of ordinary rectangles which have the same size as the portion of the area 35 intruding into the fields 38. For processing with respect to the area inside of the area 35, it is sufficient to process only the figures within unit 34. Thus, this processing can be completed very easily.

The figure processing data that has undergone overlap-removal and tone-reversal processings in this manner is temporarily stored in a data base 27 shown in FIG. 1, and thereafter undergoes, in a figure magnification/reduction processing step 28, magnification or reduction and is stored as third figure processing data in a data base 29. In this processing magnifying or reducing figures, fine adjustment of fundamental figures is performed in order that the patterns can be actually formed by a specific manufacturing technique such as etching in conformity with the design. This processing is also separately performed with respect to areas, inside and outside of the area 35.

Figure 6A:
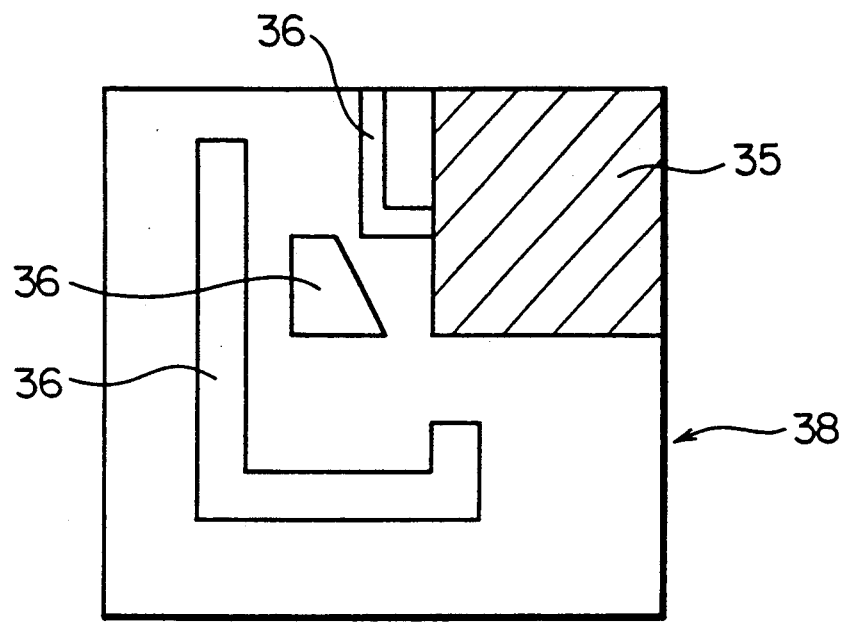
FIGS. 6A to 6B are diagrammatic views illustrating a method of treating the unit in a figure magnification/reduction step.
Figure 6B:
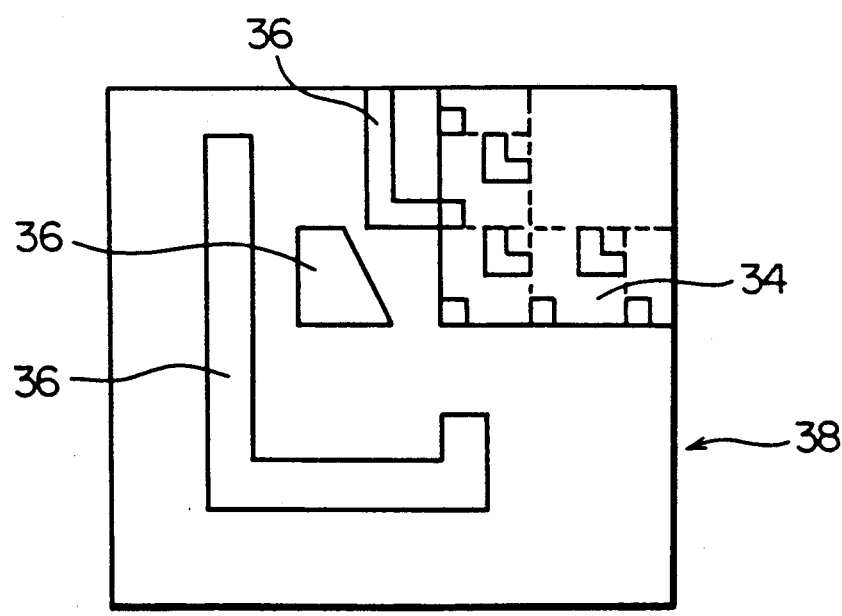
Figure 7A:
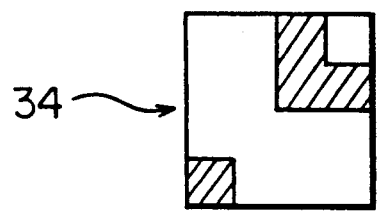
FIGS. 7A to 7C are diagrams illustrating a method of determining a unit in the figure magnification/reduction step.
Figure 7B:
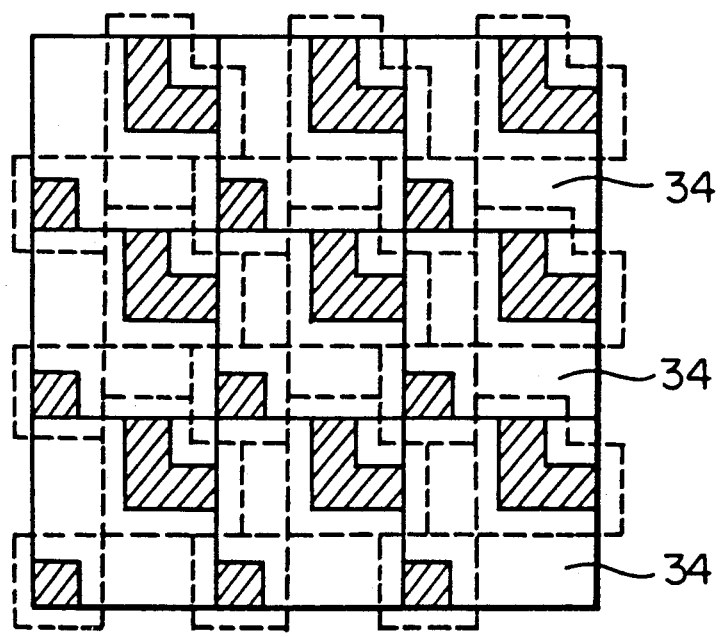
Figure 7C:
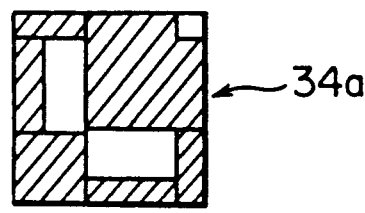
Figure 8:
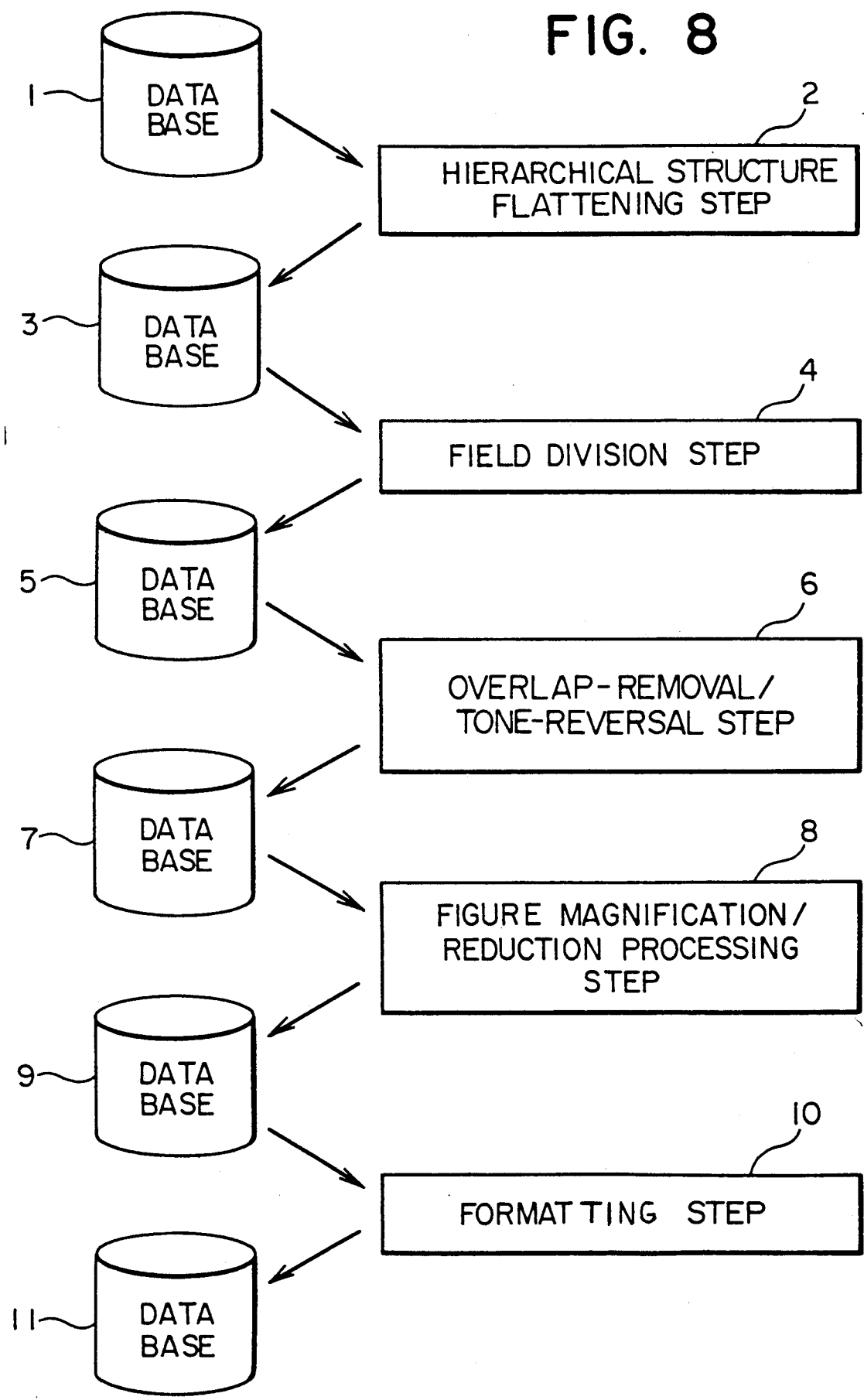
FIG. 8 is a schematic flow chart of a conventional method of preparing charged beam drawing data.

However, if, as shown in FIG. 6A, the area 35 partially intrudes into the fields 38 divided from the pattern 32 outside the area 35, figure magnification or reduction processing is performed with figures in a unit 34 attached along the boundary of the area 35 and inside the area 35 to cover a distance corresponding to one unit 34 as shown in FIG. 6B. The added figures of unit 34 are removed after the processing has been completed. This operation is intended to prevent connectivity with other figures 36 at the boundary of the area 35. Also, the magnification/reduction processing is performed considering connections between the fundamental figures. With respect to the processing inside the area 35, when figures in unit 34, each of which is shown in FIG. 7A, are disposed to form an array consisting of 3×3 units as shown in FIG. 7B, magnification/reduction processing is performed considering of connections between the fundamental figures, and one of the units 34 located at the center of the array is cut out to provide a post-processing unit 34a. FIG. 7C shows an example of the unit 34a obtained by magnifying processing.

The third figure processing data obtained separately performing modification processing with respect to the unit figures and the part of the pattern 32 outside the area 35 in the above-described manner is processed in a final formatting step 30 shown in FIG. 1 in such a manner that the unit figures 34 are arrayed in the area 35 and the whole of the pattern 32 is represented by data for the same plane. Thereafter, polygons in the fundamental figures are divided into rectangles or trapezoids, and the data is changed into a format suitable for the charged beam exposure system and is stored as charged beam drawing data in a data base 31.

In accordance with the present invention, as described above, data processing for the area 35 can be completed by processing data only, for unit 34 with respect to figure modification processing such as overlap-removal/tone-reversal processing and figure magnification/reduction processing, thereby eliminating the need for separately processing all the figures in the area 35. The speed at which charged beam drawing data are prepared is thereby remarkably improved and, at the same time, the storage capacity necessary for the processing can be markedly reduced. 4MBDRAM drawing data was actually prepared by this method. As a result, both the processing time and the storage capacity were reduced to levels less than 1/20 of those required by the conventional method.

In the above-described embodiment, data is stored in a data base when each step is completed. Instead, it is possible to design the process in such a manner that processing steps are continuously performed and the data is not stored in any data base before drawing data is formed. That is, the data bases 23, 25, 27 and 29 between the steps shown in FIG. 1 can be eliminated.

In the above-described embodiment, the figure magnification/reduction processing step 28 is carried out after the overlap-removal/tone-reversal processing 26. Conversely, the step 28 may be carried out prior to the step 26.

The steps 22, 24, 26, 28 and 30 can be carried out on the basis of a computer program. It is possible to significantly reduce the processing time by employing LSIs such as gate arrays to conduct these steps.

What is claimed is:

1. A method of preparing drawing data for a charged beam exposure system comprising:
   constructing from pattern data describing features representing elements in a semiconductor integrated circuit, a pattern having a total area, at least one reiterative unit, each reiterative unit representing a repeating sub-pattern of features, a plurality of identical reiterative units being disposed in a respective array, the respective reiterative units being contiguously disposed without any gaps therebetween in the respective arrays, each array representing a subarea within the total area;
   converting the pattern data into first figure processing data including pattern data for the total area and for each of the sub-areas and corresponding reiterative units;
   dividing the first figure processing data into a plurality of fields, each field chosen to accommodate characteristics of a charged beam exposure system and representing a portion of the total area, some of the fields representing areas including part or all of an array, each field including any part of an array including only a whole number of reiterative units of the respective array, to form second figure processing data;
   performing figure modification processing of the second figure processing data for each field, separately processing second figure processing data representing areas in each field, if any, not including any reiterative units and representing areas in each field, if any, including reiterative units to form third figure processing data; and
   converting the third figure processing data into drawing data for the charged beam exposure system.

2. A method according to claim 1 wherein figure modification processing includes removing data representing areas in each field not within a reiterative unit.

3. A method according to claim 1 wherein figure modification processing includes tone reversal processing.

4. A method according to claim 1 wherein figure modification processing includes modification of second figure processing data by magnifying and reducing areas represented by the second figure processing data.

5. A method according to claim 4 including, when the magnifying and reducing processing is performed, removing a peripheral portion of an array of the reiterative units.

6. A method according to claim 4 including, if at least one reiterative unit intrudes into one of the fields, said magnifying and reducing processing for the field excluding the at least one reiterative unit includes the data for the reiterative units disposed adjacent the area and within the field excluding the at least one reiterative unit.

7. A method according to claim 4 including performing said magnifying and reducing processing for a field with the reiterative units that are arrayed around a selected reiterative unit in the field.

8. A method according to claim 1 including, if each of the reiterative units is larger than a pitch of an array because the reiterative units overlap each other, defining each reiterative unit as a region defined by the pitch of the array and determining the array area by removing a peripheral portion of a region corresponding to the center of the array and the reiterative units adjacent the center.

* * * * *